(12) United States Patent
Visser et al.

(10) Patent No.: US 7,768,627 B2
(45) Date of Patent: Aug. 3, 2010

(54) ILLUMINATION OF A PATTERNING DEVICE BASED ON INTERFERENCE FOR USE IN A MASKLESS LITHOGRAPHY SYSTEM

(75) Inventors: Huibert Visser, Zevenhuizen (NL); Hedser Van Brug, 's Gravenhage (NL)

(73) Assignee: ASML Netherlands B.V., Veldhoven (NL)

(*) Notice: Subject to any disclaimer, the term of this patent is extended or adjusted under 35 U.S.C. 154(b) by 673 days.

(21) Appl. No.: 11/763,276

(22) Filed: Jun. 14, 2007

(65) Prior Publication Data

US 2008/0309906 A1    Dec. 18, 2008

(51) Int. Cl.
G03B 27/54    (2006.01)
G03B 27/42    (2006.01)

(52) U.S. Cl. .......................................... 355/67; 355/53

(58) Field of Classification Search ............... 355/67, 355/53; 430/22, 30
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 2004/0041104 A1 | 3/2004 | Liebregts et al. | |
| 2004/0130561 A1 | 7/2004 | Jain | |
| 2005/0007572 A1 | 1/2005 | George et al. | |

FOREIGN PATENT DOCUMENTS

| | | |
|---|---|---|
| WO | WO 98/33096 A1 | 7/1998 |
| WO | WO 98/38597 A2 | 9/1998 |
| WO | WO 98/38597 A3 | 9/1998 |

OTHER PUBLICATIONS

Troost et al., U.S. Appl. No. 11/311,643, filed Dec. 20, 2005, entitled "Lithographic Apparatus and Device Manufacturing Method Using Multiple Exposures and Multiple Exposure Types".

Bleeker et al., U.S. Appl. No. 11/311,640, filed Dec. 20, 2005, entitled "Lithographic Apparatus and Device Manufacturing Method Using Interferometric and Maskless Exposure Units".

Primary Examiner—Peter B Kim
(74) Attorney, Agent, or Firm—Sterne, Kessler, Goldstein & Fox P.L.L.C

(57) ABSTRACT

A lithographic apparatus in which beams of radiation are projected onto an array of individually controllable elements, such that the beams interfere. Radiation that is further modulated by the array of individually controllable elements is projected onto a substrate.

15 Claims, 5 Drawing Sheets

ILLUMINATION OF A PATTERNING DEVICE BASED ON INTERFERENCE FOR USE IN A MASKLESS LITHOGRAPHY SYSTEM

BACKGROUND

1. Field of the Invention

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In maskless lithography, there is a continual drive to produce smaller pattern features on a substrate, for example by reducing a size of each individually controllable elements within an array of individually controllable elements. In addition, there is a continual drive to improve contrast attainable by arrays of individually controllable elements used to pattern a radiation beam in a maskless lithography process.

One of the obstacles to improving the attainable contrast is the difficulty in providing arrays of individually controllable elements that can generate a "true black," e.g., can set individually controllable elements to a state in which substantially no radiation is projected onto the substrate in a corresponding portion of the pattern imaged onto the substrate. This is because, for known arrays of individually controllable elements, in addition to active parts of the array, e.g., elements that may be switched between different states to modulate the beam of radiation, there are passive components that may not be switched between states but are integral to the formation of the array. For example, in an array of tilting mirrors, the passive components may include the hinges about which the mirrors tilt and the space between adjacent mirrors that is necessary to provide clearance between the tilting mirrors. Such passive elements of an array of individually controllable elements result in stray radiation being scattered through the lithography system, such that some radiation is always incident on every part of a substrate, e.g., reducing the attainable contrast. In addition, scattering from the edges of the tilting mirrors further increases the stray radiation, reducing the obtainable contrast even further.

Previously, it has been proposed to reduce these problems by modifying the structure of the array of individually controllable elements. For example, it has previously been proposed to provide the tilting mirrors of an array with a quarter wavelength phase step on a half of each mirror. However, such modifications of the arrays of individually controllable elements increase the cost of manufacturing the arrays of individually controllable elements, increase the likelihood of formation errors within the array of individually controllable elements (in turn further increasing the cost of manufacturing the arrays of individually controllable elements and reducing the number of individually controllable elements that may practically be combined in a single array) and make it more difficult to reduce the size of the individually controllable elements.

Therefore, what is needed is a system and method that allow for modulating a beam of radiation.

SUMMARY

In one embodiment of the present invention, there is provided a lithographic apparatus, comprising an array of individually controllable elements, an interference projection system, and a projection system. The interference projection system is configured to project at least two beams of radiation onto the array of individually controllable elements, such that the beams of radiation interfere at the surface of the array of individually controllable elements. The array of individually controllable elements is configured to modulate the radiation projected onto the array by the interference projection system. The projection system is configured to project onto a substrate the radiation modulated by the array of individually controllable elements.

In another embodiment of the present invention, there is provided a device manufacturing method comprising the following steps. Projecting at least two beams of radiation onto an array of individually controllable elements, such that the beams of radiation interfere at the surface of the array of individually controllable elements. Modulating the radiation incident on the array of individually controllable elements using the array. Projecting onto a substrate the radiation modulated by the array of individually controllable elements.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
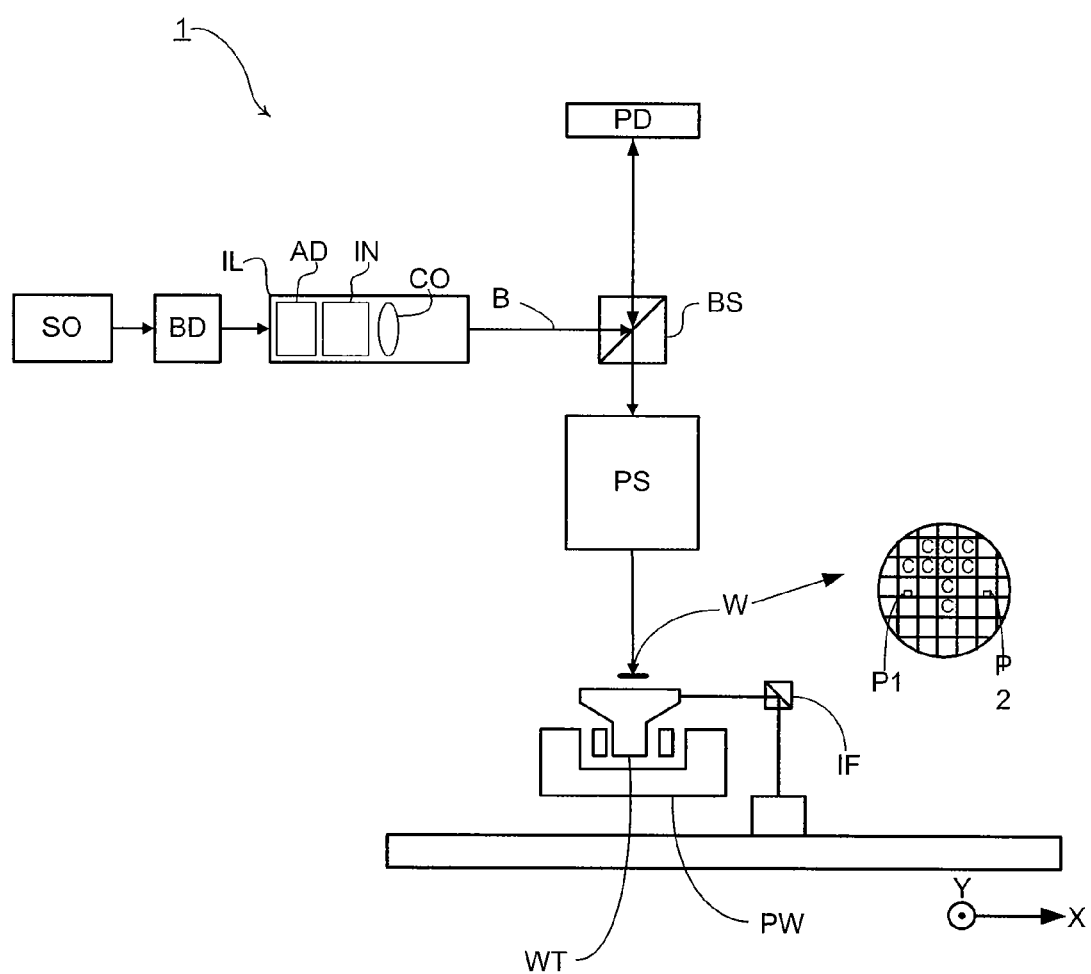
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 µm, at least 100 µm, at least 200 µm, at least 300 µm, at least 400 µm, at least 500 µm, or at least 600 µm. Alternatively, the thickness of the substrate can be at most 5000 µm, at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
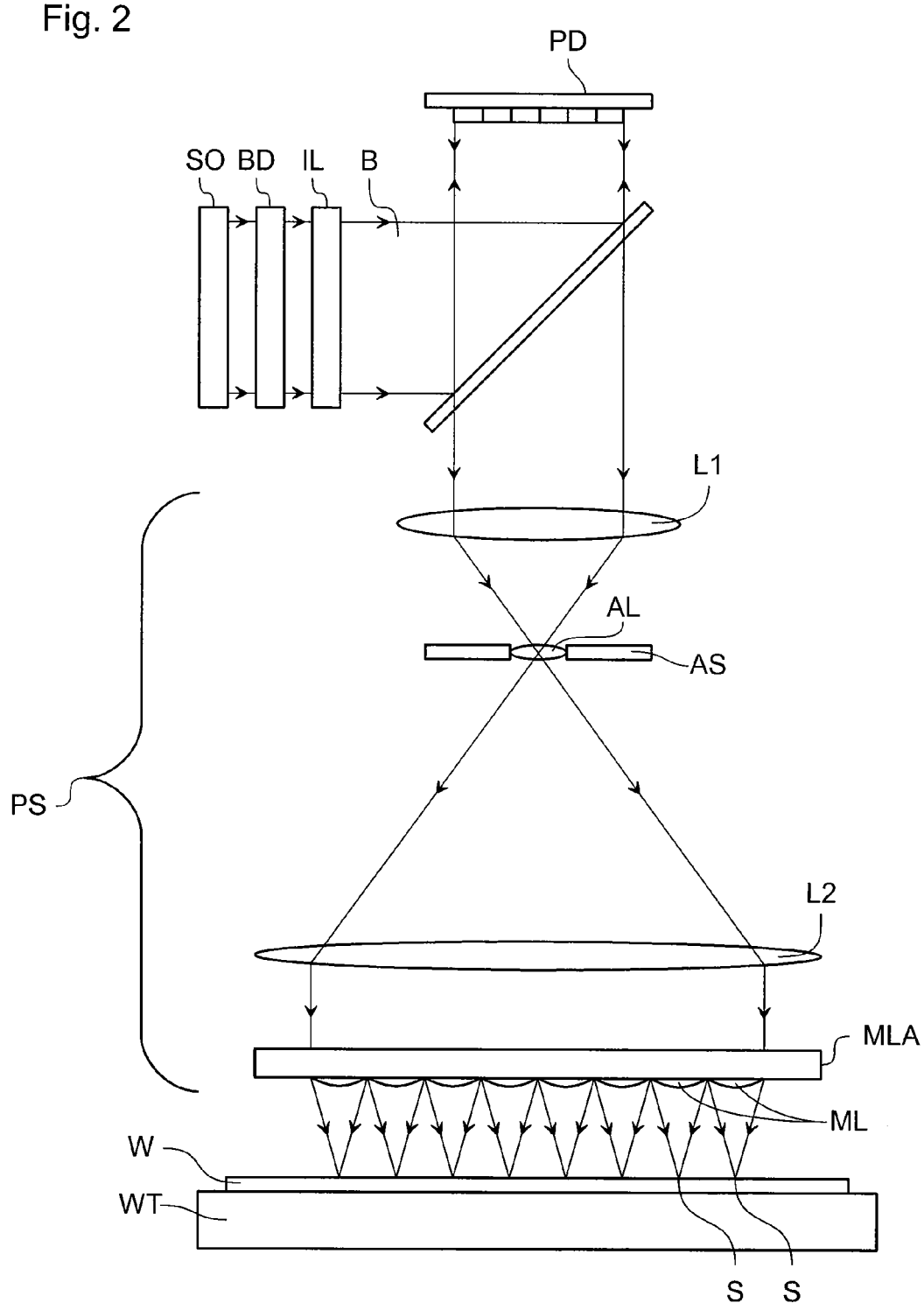

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system.

Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 10 nm, at least 175 nm, at least 200 nm, at least 250 nm, at least 275 nm, at least 300 nm, at least 325 nm, at least 350 nm, or at least 360 mm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
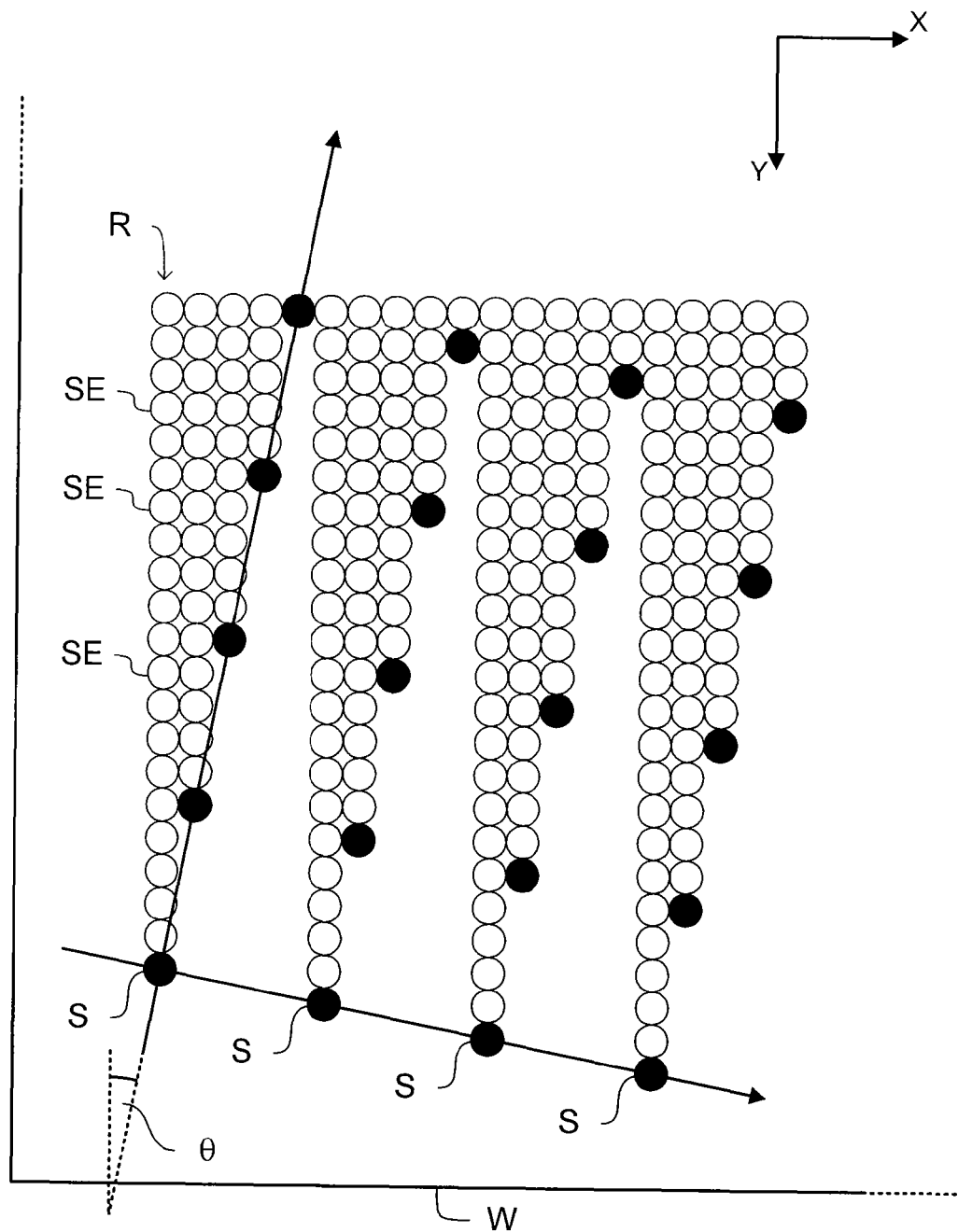
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
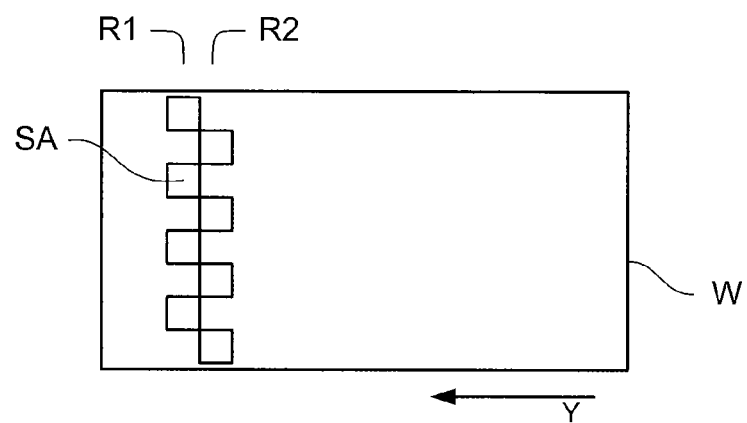
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
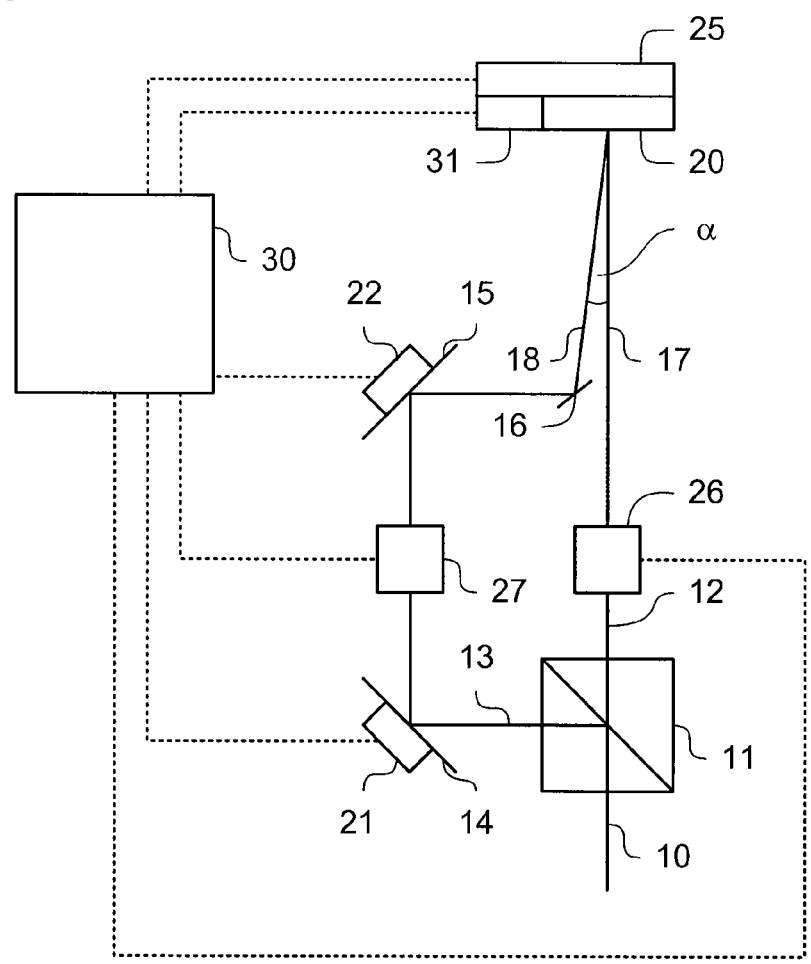
FIG. 5 depicts in more detail part of a lithographic apparatus.

FIG. 5 depicts in more detail a portion of the lithographic apparatus shown in FIG. 1. In particular, FIG. 5 depicts an interference projection system that is used to project radiation onto the array of individually controllable elements. As shown, the beam of radiation 10 is divided by a radiation beam splitter 11 into first and second optical paths 12, 13. By means of suitable optical components, in the case of the arrangement depicted in FIG. 5, reflectors 14, 15, 16, the radiation directed into the first and second optical paths, 12, 13 is projected onto the array of individually controllable elements 20, such that the two beams of radiation 17, 18 interfere at the surface of the array of individually controllable elements on which they are incident. In particular, the two beams of radiation 17, 18 are incident on the array of individually controllable elements 20 at substantially the same location and at a small angle $\alpha$. Consequently, the radiation projected onto the array of individually controllable elements 20 forms an interference pattern, in this case interference fringes, on the array of individually controllable elements 20, e.g., alternating bands of maximum and minimum radiation intensity.

The angle $\alpha$ between the two beams of radiation 17, 18 projected onto the array of individually controllable elements by the interference projection system is determined by, for example, the wavelength of the radiation, the required width of the interference fringes and the angle at which the average direction of the beams of radiation are incident on the array of individually controllable elements.

The benefit of using an interference projection system, such as that discussed above and as depicted in FIG. 5 for projecting radiation onto an array of individually controllable elements 20, is discussed with reference to FIGS. 6 and 7. The array of individually controllable elements may, for example, be an array of tilting mirrors. In that case, the interference projection system may be conveniently configured such that the interference fringes are oriented parallel to the orientation of the hinges of the tilting mirrors. Furthermore, the period of the interference fringes may be set to be equal to half the separation of the hinges of adjacent reflectors, e.g., the separation of the adjacent axes of rotation of the adjacent reflectors. With such an arrangement, the radiation distribution across each individually controllable element created by the interference pattern will be the same for all of the individually controllable elements.

Figure 6:
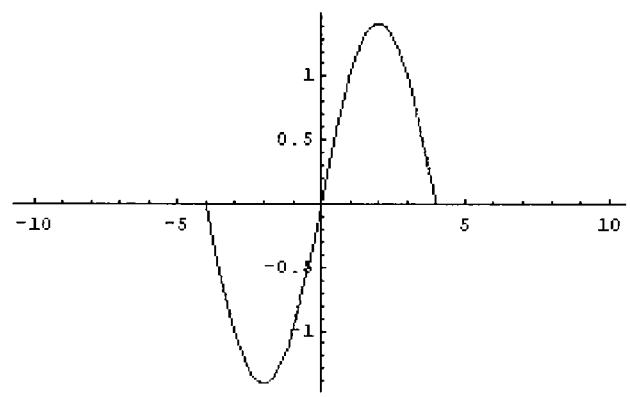
FIG. 6 depicts the amplitude distribution of radiation on an individually controllable element in an array.
Figure 7:
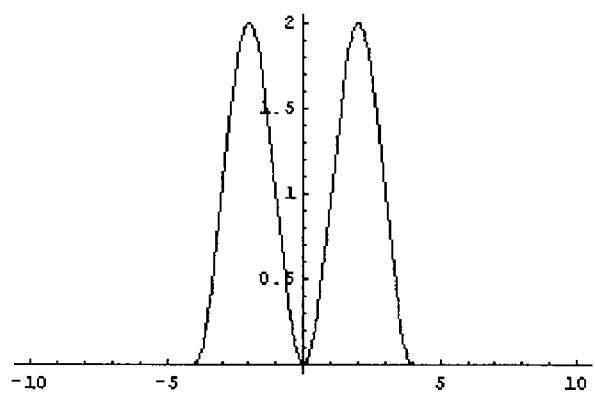
FIG. 7 depicts the radiation intensity distribution on an individually controllable element in an array.

FIG. 6 depicts the amplitude distribution across the width of a single period of the interference fringes. FIG. 7 depicts the corresponding radiation intensity distribution. As shown, within a single period across the width of the interference fringes, there are two peaks of intensity, corresponding to bands of maximum radiation intensity within the interference fringes. However, the radiation of the two bands of maximum intensity radiation are mutually out of phase. Therefore, for tilting mirrors that are configured such that the hinge lies substantially in the center of the mirror, the interference pattern projected onto the array of individually controllable elements by the interference projection system may be arranged such that each half of each tilting mirror is illuminated by one of the peaks of maximum radiation intensity. This may provide two benefits. Firstly, arranging the interference pattern in this fashion necessarily also results in the radiation intensity at the hinges and at the edges of the mirrors being at a minimum. Accordingly, the stray radiation reflected by the array of individually controllable elements is minimized. Furthermore, the radiation projected onto opposite sides of each mirror is inherently out of phase, as shown in FIG. 6. Accordingly, this arrangement for illuminating the array of individually controllable elements results in the same effect as uniformly illuminating an array of individually controllable elements comprised of rotating phase-step mirrors. However, in the present examples, the tilting mirrors are flat mirrors. The production of arrays of individually controllable elements having flat mirrors is far easier than that for phase-step mirrors. Accordingly, for flat mirrors, it is easier to manufacture arrays having smaller mirrors. Furthermore, by avoiding the illumination of the hinges and the edges of the mirrors, the size of the hinges and gaps between mirrors relative to the size of the mirrors themselves becomes less significant. This can provide a further benefit because, as one attempts to reduce the size of the mirrors, the size of the hinges and gaps between mirrors tends to increase as a proportion of the size of the mirrors themselves.

The interference projection system may be provided with one or more optical elements that may be used to control the interference pattern projected onto the array of individually controllable elements 20. For example, the optical components may include one or more lenses, prisms and/or reflectors that may be associated with an actuator provided to control the position of the optical element.

The optical elements may be provided, for example, in the first and/or second optical paths 12, 13. For example, as shown in FIG. 5, the second optical path 13 includes reflectors 14, 15 mounted on associated actuators 21, 22 that are provided to control the position of the reflectors 14, 15. The reflectors 14, 15 and associated actuators 21, 22 may, for example, be configured to adjust the angle α between the beams of radiation 17, 18 projected onto the array of individually controllable elements 20.

Alternatively or additionally, the reflectors 14, 15 and associated actuators 21, 22 may be configured to adjust the pathlength of the second optical path 13 between the radiation beam divider 11 and the array of individually controllable elements 20. Accordingly, it is possible to control the relative pathlengths of the first and second optical paths 12, 13 between the radiation beam divider 11 and the array of individually controllable elements 20, therefore controlling the relative phase of the radiation from the two optical paths at the point at which it is incident on the array of individually controllable elements 20. In turn, control of the relative phase of the two beams of radiation 17, 18 that are projected onto the array of individually controllable elements 20 provides control of the position of the interference fringes on the array in a direction perpendicular to the orientation of the fringes. Accordingly, by adjusting the pathlengths of the second optical path 13, it is possible to correctly align the interference fringes with the individually controllable elements in the array 20.

Alternatively or additionally, as depicted in FIG. 5, an actuator 25 may be provided to adjust the position of the array of individually controllable elements 20 relative to the beams of radiation 17, 18 projected onto it. Such an actuator may also permit the adjustment of the orientation of the array of individually controllable elements, for example to ensure that the orientation of the interference fringes is parallel to the orientation of the hinges of the tilting mirrors of the array of individually controllable elements.

Alternatively or additionally, additional optical components may be provided in order to adjust the position of the beams of radiation 17, 18 projected onto the array of individually controllable elements 20 relative to the array of individually controllable elements.

In order to ensure the requisite control of the interference pattern projected onto the array of individually controllable elements 20, it is desirable for the intensity of the radiation in the two beams of radiation 17, 18 projected onto the array of individually controllable elements 20 to be as similar as possible. This may be achieved by the appropriate selection of the radiation beam divider 11.

Alternatively or additionally, radiation intensity attenuators 26, 27 may be provided in the first and second optical paths 12, 13, respectively, and configured to adjust the intensity of the radiation in one or more of the optical paths 12, 13 in order that the intensity of the two beams of radiation 17, 18 projected onto the array of individually controllable elements 20 matches as closely as possible. Any suitable radiation intensity attenuator may be used. For example a pair of polarizers having an adjustable relative angle may be used to control the transmission of radiation through the radiation intensity attenuator.

The radiation intensity attenuators 26, 27 may include a sensor system, for example that directs a known proportion of the radiation to a radiation intensity sensor, to enable measurement of the radiation intensity in each of the optical paths. Alternatively or additionally, the control of the one or more radiation intensity attenuators 26, 27 may be controlled on the basis of an inspection of the interference pattern produced by the two beams of radiation 17, 18, as discussed below.

An interference projection system controller 30 may be provided to control at least one of the optical element actuators 21, 22, the radiation intensity attenuators 26, 27 and the actuator 25 controlling the position of the array of individually controllable elements 20 in order to adjust the interference patterns projected onto the array of individually controllable element 20, as required. A radiation sensor 31 may be provided to inspect the interference pattern projected onto the array of individually controllably element 20 and the interference projection system controller 30 may adjust the settings of the system based on the inspection of the radiation sensor 31.

As depicted in FIG. 5, the radiation sensor 31 may be arranged adjacent to the array of individually controllable elements 20 such that the interference pattern is projected onto the radiation sensor 31 at the same time as being projected onto the array of individually controllable elements 20. Accordingly, such a system permits continuous monitoring of the interference pattern and adjustments as necessary.

Alternatively or additionally, the lithographic apparatus may be configured such that it can be switched between an exposure configuration, in which the interference pattern is projected onto the array of individually controllable elements, and a calibration configuration, in which the interference pattern is projected onto the radiation sensor 31. Such an arrangement may be used, for example, if the interference projection system is sufficiently stable that only periodic calibration is required. Beneficially, in such an arrangement, the exposure field required for the interference projection system is reduced because it does not need to project radiation simultaneously onto the array of individually controllable elements 20 and the radiation sensor 31.

It should be appreciated that a hybrid arrangement may be provided. In this arrangement, a part of the interference pattern is projected onto the radiation sensor 31, permitting some continuous monitoring and control of the interference pattern. Periodically, a calibration procedure is performed, in which the radiation sensor 31 can inspect different parts of the interference pattern in order to provide calibration data necessary to ensure sufficient uniformity of the interference pattern across the array of individually controllable elements.

It should also be appreciated that in an arrangement in which an actuator 25 is provided to adjust the position of the array of individually controllable elements 20, the actuator may be used to move the array of individually controllable elements 20 and the radiation sensor 31 between the exposure configuration and the calibration configuration. Alternatively, separate actuators may be provided to switch between the two configurations and/or to control the position of the array of individually controllable elements 20 and the radiation sensor 31. As a further alternative, a reflector may be provided that may be switched between a first position, in which it does not interfere with the beams of radiation 17, 18 projected onto the array of individually controllable elements 20, and a second position, in which it reflects the beams of radiation 17, 18 to the radiation sensor which is arranged, such that it can inspect the interference pattern that would be projected onto the array of individually controllable elements 20 if the reflector were in the first position.

It should further be appreciated that, although the invention has been described above in relation to the embodiment depicted in FIG. 5, variations are possible. For example, although in the arrangement depicted in FIG. 5, the beam of radiation 10 provided by the illumination system is divided into first and second optical paths which provide the beams of radiation 17, 18 that interfere at the array of individually controllable elements 20, the interference projection system may be configured to project independently generated beams of radiation onto the array of individually controllable elements such that they interfere. For example, beams of radiation generated by separate sources of radiation may be used. Alternatively, the interference projection system may be configured to provide two spherical wavefronts that interfere, such that the propagation directions of the two beams are equal, and such that the fringe spacing is determined by the beam separation. It should also be appreciated that interference patterns other than interference fringes generated by two interfering beams of radiation may be used. In particular, by projecting four beams of radiation onto the array of individually controllable elements, such that they interfere, it may be possible to create a checker-board interference pattern which may provide further benefits.

It should further be appreciated that arrangements of the lithographic apparatus other than the arrangement depicted in FIG. 1 may be used. In particular, the interference projection system may project the two interfering beams of radiation onto the array of individually controllable elements at an oblique angle relative to the surface of the array of individually controllable elements, such that the modulated interference pattern propagating from the array of individually controllable elements can be projected directly onto a substrate rather than, for example, passing through some of the components used to direct the radiation onto the array of individually controllable elements, as depicted in FIG. 1. Such an arrangement may permit the use of a larger angle α between the interfering beams of radiation projected onto the array of individually controllable elements 20.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
an array of individually controllable elements;
an interference projection system that is configured to project at least two beams of radiation onto the array of individually controllable elements, such that the beams of radiation interfere at a surface of the array of individually controllable elements;
wherein the array of individually controllable elements is configured to modulate the radiation projected onto the array by the interference projection system; and
a projection system, configured to project onto a substrate the radiation modulated by the array of individually controllable elements.

2. The lithographic apparatus of claim 1, wherein:
the interference projection system is configured to project two beams of radiation onto the array of individually controllable elements, such that the radiation incident on the array comprises a plurality of interference fringes parallel to a first direction; and
each individually controllable element of the array of individually controllable elements comprises a reflector configured to be rotatable about an axis of rotation parallel to the first direction.

3. The lithographic apparatus of claim 2, wherein the interference projection system is configured to project the two beams of radiation onto the array of individually controllable elements, such that a period of the interference fringes, measured in a direction perpendicular to the first direction, equals half the separation of the axes of rotation of adjacent reflectors of the array of individually controllable elements, measured in the direction perpendicular to the first direction.

4. The lithographic apparatus of claim 3, wherein:
the reflectors are configured such first and second parts of each of the reflectors are arranged on first and second sides, respectively, of the axis of rotation of the reflector; and
the interference projection system is configured to project the two beams of radiation onto the array of individually controllable elements, such that a band of maximum radiation intensity within the interference fringes is incident on each of the first and second parts of each of the reflectors.

5. The lithographic apparatus of claim 1, wherein the interference projection system comprises:

one or more optical elements configured to adjust: (a) a relative angle of the beams of radiation at the surface of the array of individually controllable elements, (b) a position of one or more of the beams of radiation, relative to the array of individually controllable elements, at which the one or more beams of radiation are incident on the array, (c) a relative phase of the beams of radiation or (d) a relative intensity of the beams of radiation.

6. The lithographic apparatus of claim 5, wherein the one or more optical elements comprises a variable radiation intensity attenuator.

7. The lithographic apparatus of claim 5, wherein the one or more optical elements comprises a lens, prism or a reflector and an actuator, the actuator being configured to adjust a position of the lens, prism or reflector.

8. The lithographic apparatus of claim 7, further comprising an interference projection system controller configured to control the actuators of the one or more optical elements in order to adjust the interference pattern projected onto the array of individually controllable elements by the interference projection system.

9. The lithographic apparatus of claim 1, further comprising a radiation sensor configured to inspect the interference pattern projected by the interference projection system.

10. The lithographic apparatus of claim 9, wherein the radiation sensor is located adjacent the array of individually controllable elements, such that the radiation sensor inspects the interference pattern being projected onto the array.

11. The lithographic apparatus of claim 9, further comprising:
an actuator system configured to switch the lithographic apparatus between a first configuration, in which the interference projection system projects radiation onto the array of individually controllable elements, and a second configuration, in which the interference projection system projects radiation onto the radiation sensor, such that the radiation sensor inspects the interference pattern that would be projected onto the array of individually controllable elements if the lithographic apparatus were in the first configuration.

12. The lithographic apparatus of claim 1, further comprising:
an actuator configured to adjust a position of the array of individually controllable elements relative to the beams of radiation projected onto the array by the interference projection system.

13. The lithographic apparatus of claim 1, wherein the interference projection system comprises a radiation beam divider configured to divide a beam of radiation into the at least two beams of radiation projected into the array of individually controllable elements.

14. The lithographic apparatus of claim 1, wherein the interference projection system is configured to project four beams of radiation onto the array of individually controllable elements, such that the radiation incident on the array comprises a checker-board interference pattern.

15. A device manufacturing method, comprising:
projecting at least two beams of radiation onto an array of individually controllable elements, such that the beams of radiation interfere at a surface of the array of individually controllable elements;
modulating the radiation incident on the array of individually controllable elements using the array; and
projecting onto a substrate the modulated radiation.

* * * * *